US006951587B1

(12) United States Patent
Narushima

(10) Patent No.: US 6,951,587 B1
(45) Date of Patent: Oct. 4, 2005

(54) CERAMIC HEATER SYSTEM AND SUBSTRATE PROCESSING APPARATUS HAVING THE SAME INSTALLED THEREIN

(75) Inventor: Masaki Narushima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/722,485

(22) Filed: Nov. 28, 2000

(30) Foreign Application Priority Data

Dec. 1, 1999 (JP) .................................. 11-341916

(51) Int. Cl.[7] .......................... C23C 16/00; C23F 1/00; H01L 21/306
(52) U.S. Cl. ............ 118/728; 156/345.51; 156/345.52; 156/345.53
(58) Field of Search ........................... 118/728, 723 E, 118/715, 723 R, 723 I, 724, 725, 719, 723 W; 279/128; 216/67, 71, 59, 39; 438/710, 729, 438/905; 204/192.12; 219/544; 156/345.26, 156/345.51, 345.52, 345.53

(56) References Cited

U.S. PATENT DOCUMENTS

| | | | | |
|---|---|---|---|---|
| 3,911,386 A | * | 10/1975 | Beaudoin et al. | ............. 338/34 |
| 4,622,687 A | * | 11/1986 | Whitaker et al. | ............ 378/130 |
| 5,078,851 A | * | 1/1992 | Nishihata et al. | ....... 118/723 R |
| 5,155,652 A | * | 10/1992 | Logan et al. | ................ 279/128 |
| 5,280,156 A | * | 1/1994 | Niori et al. | .................. 118/725 |
| 5,306,895 A | | 4/1994 | Ushikoshi et al. | .......... 436/547 |
| 5,376,213 A | | 12/1994 | Ueda et al. | ............. 156/345.53 |
| 5,415,225 A | * | 5/1995 | Randlett et al. | ............. 165/133 |
| 5,547,539 A | * | 8/1996 | Arasawa et al. | ........ 156/345.26 |
| 5,595,241 A | | 1/1997 | Jelinek | ........................ 118/725 |
| 5,665,166 A | * | 9/1997 | Deguchi et al. | ............. 118/724 |
| 5,665,260 A | * | 9/1997 | Kawada et al. | ............. 219/544 |
| 5,675,471 A | * | 10/1997 | Kotecki | ....................... 361/234 |
| 5,753,132 A | * | 5/1998 | Shamouilian et al. | ......... 216/39 |
| 5,788,799 A | * | 8/1998 | Steger et al. | .......... 156/345.37 |
| 5,800,618 A | * | 9/1998 | Niori et al. | .................. 118/725 |
| 5,846,375 A | * | 12/1998 | Gilchrist et al. | ......... 118/723 E |
| 5,880,924 A | * | 3/1999 | Kumar et al. | ................ 279/128 |

(Continued)

FOREIGN PATENT DOCUMENTS

| | | | |
|---|---|---|---|
| JP | 63-276225 | 11/1988 | |
| JP | 7-130830 | * 5/1995 | ........... H01L 21/68 |
| JP | 7-272834 | 10/1995 | |
| JP | 407335630 | * 12/1995 | ....... H01L 21/3065 |
| JP | 8-17747 | 1/1996 | |
| JP | 9-219439 | 8/1997 | |

OTHER PUBLICATIONS

Machine Translation from http://www1.ipdl.jpo.go.jp/PA1/cgi-bin/PA1DETAIL.*

Primary Examiner—Rudy Zervigon
(74) Attorney, Agent, or Firm—Oblon, Spivak, McClelland, Maier & Neustadt, P.C.

(57) ABSTRACT

A ceramic heater system has a ceramic heater base having a substrate-mounting surface formed on the top surface thereof and a heater, buried in the heater base, for heating a substrate. A fluid passage is formed buried in the heater base below where the heater is buried. The heater base is cooled as a fluid whose temperature is lower than the temperature of the heater base is let flow in the fluid passage. A substrate processing apparatus has the ceramic heater system installed in a process chamber whose vacuum state can be maintained, a gas supply mechanism for feeding a gas into the process chamber, and a power supply. The substrate processing apparatus performs a heat treatment, etching and film deposition on a substrate placed in the process chamber.

36 Claims, 8 Drawing Sheets

U.S. PATENT DOCUMENTS

| | | | | |
|---|---|---|---|---|
| 5,900,103 A | * | 5/1999 | Tomoyasu et al. | 118/723 E |
| 6,074,518 A | * | 6/2000 | Imafuku et al. | 118/723 E |
| 6,081,414 A | * | 6/2000 | Flanigan et al. | 279/128 |
| 6,101,969 A | * | 8/2000 | Niori et al. | 118/723 R |
| 6,106,737 A | * | 8/2000 | Tomoyasu et al. | 204/192.12 |
| 6,135,052 A | * | 10/2000 | Fujii et al. | 118/723 E |
| 6,143,128 A | * | 11/2000 | Ameen et al. | 117/719 |
| 6,197,246 B1 | * | 3/2001 | Niori et al. | 118/723 E |
| 6,391,147 B2 | * | 5/2002 | Imafuku et al. | 118/723 E |
| 2001/0020516 A1 | * | 9/2001 | Khan et al. | 156/345 |

* cited by examiner

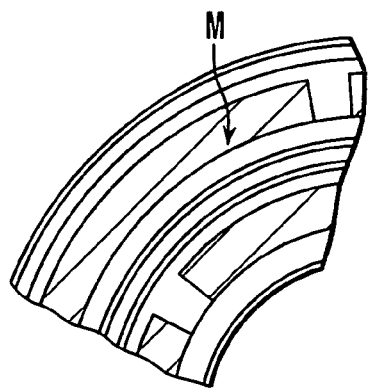
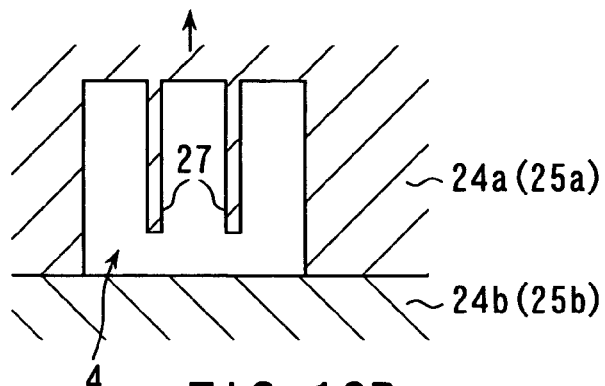
FIG. 10A  FIG. 10B
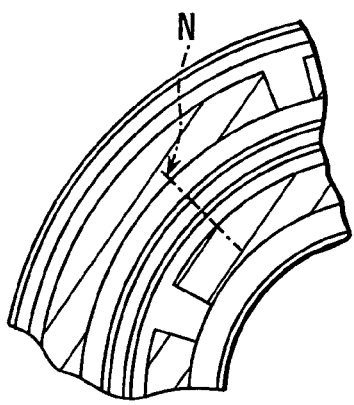
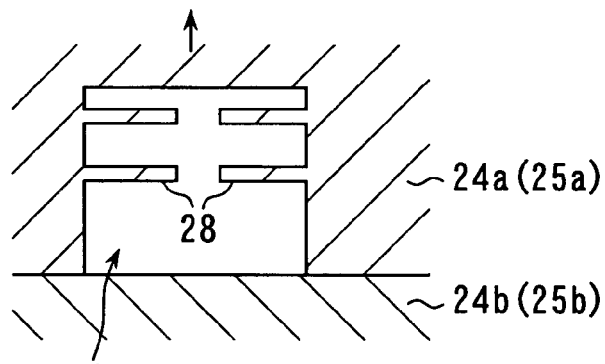
FIG. 11A  FIG. 11B
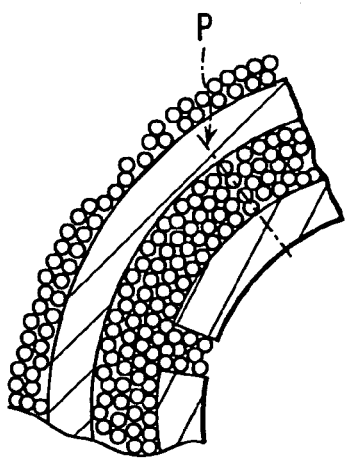
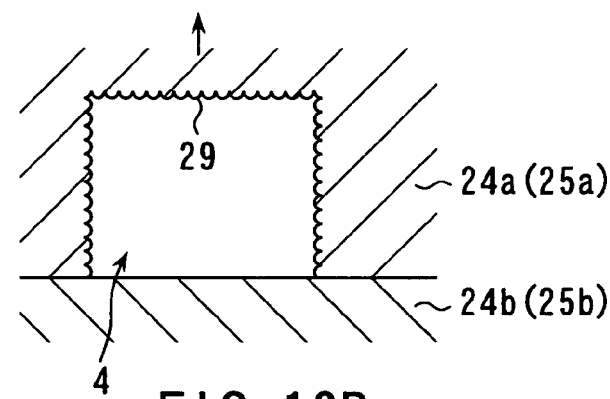
FIG. 12A  FIG. 12B

US 6,951,587 B1

CERAMIC HEATER SYSTEM AND SUBSTRATE PROCESSING APPARATUS HAVING THE SAME INSTALLED THEREIN

CROSS-REFERENCE TO RELATED APPLICATIONS

This application is based upon and claims the benefit of priority from the prior Japanese Patent Application No. 11-341916, filed Dec. 1, 1999, the entire contents of which are incorporated herein by reference.

BACKGROUND OF THE INVENTION

The present invention relates to ceramic heater system which heats a substrate in treatments, such as CVD (Chemical Vapor Deposition) and plasma etching, and to a substrate processing apparatus having this heater system installed therein.

The general fabrication of semiconductor devices includes a step of performing a vacuum treatment, such as CVD or plasma etching, on a semiconductor wafer to be processed. In such a treatment, a heat treatment for heating a semiconductor wafer to a predetermined temperature is carried out. To execute such a heat treatment, a heater is buried in a substrate support member. A typical conventional heater of this type is a stainless heater.

Ceramic heaters that are hard to be corroded by halogen-base gases which are used in processing semiconductor wafers and have a high heat exchanging efficiency have been developed recently and are becoming popular. Such a ceramic heater has a heat generating wire of a high-melting-point metal buried in a heater base which is a dense ceramic sintered body of AlN or the like and on the top of which a semiconductor wafer is to be mounted.

A heat treatment which is executed at the time of performing CVD, plasma CVD or the like is demanded of an extremely high uniform heating performance while heating a semiconductor wafer to 500° C. or higher.

Further, it is required that semiconductor wafers should be resistant to plasma during plasma etching.

Because it is difficult to provide the desired uniform heating by a ceramic heater alone, which is buried in the heater base, various schemes are attempted to achieve the uniform heating. For example, the technique that is disclosed in Jpn. Pat. Appln. KOKAI Publication No. 272834/1995 has a fluid passage with a fine cross-sectional area provided between a semiconductor-wafer mounting surface of a ceramic heater base and a buried heater. The temperature differences at individual positions of the ceramic heater base are therefore reduced by the convection of a fluid flowing in the fluid passage, thereby ensuring a uniform heating temperature on the mounting surface.

There are demands for further improvement of the throughput in the fabrication of semiconductor devices is demanded of and for a shorter down time at the time of maintenance of the substrate processing apparatus.

For example, a single wafer type CVD system regularly executes in-situ cleaning with a halogen-base gas and needs to lower the temperature of a ceramic heater to 150 to 500° C. from a film deposition temperature of 700° C. As the conventional cooling time is about 3 hours, a shorter cooling time is demanded. The interior of the chamber is exposed to the atmosphere for maintenance or the like. The interior of the chamber is cooled to near the room temperature to facilitate the maintenance. The cooling requires a long time. It is demanded that the cooling be achieved within a short time.

The aforementioned technique disclosed in Jpn. Pat. Appln. KOKAI Publication No. 272834/1995 can cool the heater base by the flow of the fluid at the time of maintaining the processing apparatus that uses the ceramic heater. This can shorten the down time in which the apparatus is stopped.

Generally speaking, to provide a sufficient cooling performance, the cross-sectional area of the fluid passage should be increased to permit the flow of a larger amount of fluid to carry the heat out. This technique has been developed to mainly ensure uniform heating and does not provide a sufficient cooling performance. Since the technique is intended to make the heating temperature on the mounting surface even, however, it is necessary to avoid deterioration of the heating efficiency. This is achieved by preventing the heat transmission from the heater to the mounting surface from becoming lower, and requires that the cross-sectional area of the fluid passage be made as small as possible.

Therefore, the more the heating efficiency is improved, the less the performance of the cooling means for the heater becomes sufficient. The conventional technique suffers a limitation to shortening the time of cooling the heater base and faces a difficulty in satisfying the demanded short cooling time.

BRIEF SUMMARY OF THE INVENTION

Accordingly, it is an object of the present invention to provide a ceramic heater system which has a high cooling efficiency while keeping the uniform heating performance on the heating surface high, and a substrate processing apparatus in which this ceramic heater system is installed.

A ceramic heater system according to this invention comprises a ceramic heater base having a substrate mounting surface formed on a top surface thereof; a heater, buried in the heater base, for heating a substrate; and a fluid passage provided in the heater base below the heater, whereby the heater base is cooled by letting a fluid whose temperature is lower than a temperature of the heater base flow in the fluid passage.

A substrate processing apparatus in which such a ceramic heater system is installed comprises a chamber whose interior can be kept in a vacuum state by an exhaust system and processing means for performing a predetermined treatment on the substrate in the chamber, and performs film deposition and etching on the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 10A and 10B are cross-sectional views depicting a ceramic heater system according to a sixth embodiment;

FIGS. 11A and 11B are cross-sectional views depicting a ceramic heater system according to a first modification of the sixth embodiment;

FIGS. 12A and 12B are cross-sectional views depicting a ceramic heater system according to a second modification of the sixth embodiment;

DETAILED DESCRIPTION OF THE INVENTION

Preferred embodiments of the present invention will now be described with reference to the accompanying drawings.

Figure 1:
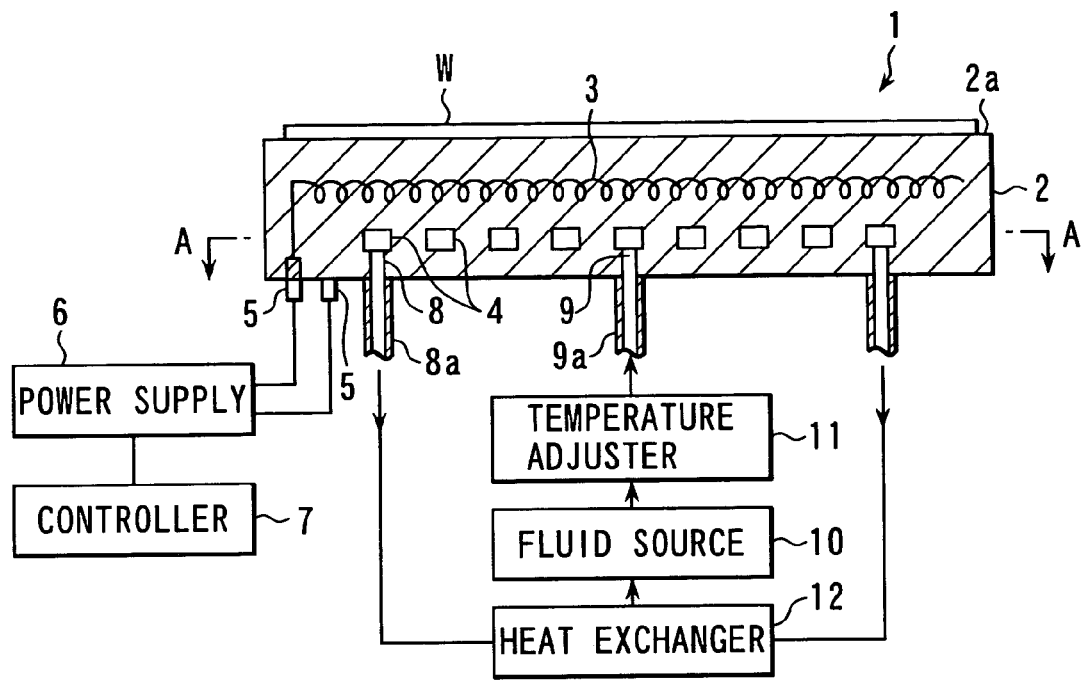
FIG. 1 is a vertical cross-sectional view exemplarily illustrating a ceramic heater system according to a first embodiment of the present invention.
Figure 2:
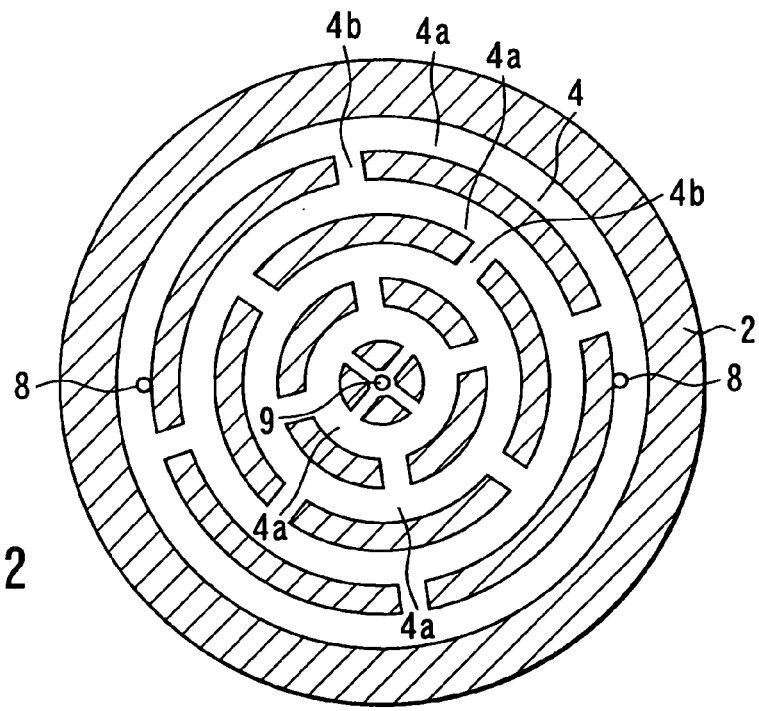
FIG. 2 is a horizontal cross-sectional view along the line A—A in FIG. 1.

FIG. 1 is a vertical cross-sectional view exemplarily illustrating a ceramic heater system for processing a semiconductor wafer according to the first embodiment of the invention. FIG. 2 is a horizontal cross-sectional view taken along the line A—A in FIG. 1.

A ceramic heater system 1 has a disk-shaped heater base 2 of ceramics and a heating resistive element (heater) 3 buried in the heater base 2 in a coil form. A fluid passage 4 is provided in the heater base 2 below the heater 3.

Any dense ceramics may be used for the heater base 2. Preferable ceramics for the heater base 2 include nitride ceramics, such as silicon nitride ($Si_3N_4$), aluminum nitride (AlN) and silicon aluminum oxy nitride (SiAlON), and aluminum oxide ($Al_2O_3$). The top surface of the heater base 2 serves as a mounting surface 2a for a semiconductor wafer W.

The heater 3, which is a heat resistor, is buried in the heater base 2 in a predetermined pattern (e.g., a spiral form) with its both end portions connected to terminals 5 buried in the vicinity of the peripheral portion of the bottom of the heater base 2. The heater 3 is connected to a power supply 6 by wires that run from the terminals 5. The output of the power supply 6 is controlled by a controller 7 based on a detection signal from an unillustrated thermocouple provided on the heater base 2. The semiconductor wafer W is thereby heated to the desired temperature. The heater 3 is formed of metal, and can be a nichrome wire when the heating temperature is relatively low. For a high-temperature ceramic heater, however, a high-melting-point metal is preferable. A particularly preferable metal is tungsten (W), molybdenum (Mo), platinum (Pt) or an alloy of the mentioned metals.

As shown in FIG. 2, the fluid passage 4 has a plurality of annular portions 4a concentric to the heater base 2, and radial portions 4b which radially link adjoining annular portions 4a at four locations. The radial portions 4b that are adjacent to one another in the peripheral direction are arranged at equidistances of 90°, while the radial portions 4b that are adjacent to one another in the radius direction are shifted by 45° from one another. Preferably, the radial portions 4b are interposed between the annular portions 4a. In this case, the radial portions 4b do not overlap the annular portions 4a. In the fluid passage, the annular portions 4a and radial portions 4b are arranged so that semiconductor wafers may be heated and cooled with high efficiency. A fluid supply hole 9, through which a fluid is supplied into the fluid passage 4, is formed in the center of the heater base 2. Two fluid discharge holes 8 are formed at opposite positions of the outermost annular portion 4a.

Moreover, the holes connecting any two adjacent circular portions are arranged at regular intervals along either circular portion. Each hole made in one of walls defining a circular portion opens to that part of the other wall of the circular portion, which is located between two adjacent holes made in the other wall of the circular portion.

Designing the fluid passage 4 this way ensures effective heat exchange and a high cooling efficiency. A fluid supply pipe 9a is connected to the fluid supply hole 9, and fluid discharge pipes 8a to the fluid discharge holes 8. Those pipes 8a and 9a are connected to a fluid supply source 10 so that the fluid is circulated by an unillustrated pump or similar means. The temperature of the gas that is supplied from the fluid supply source 10 is adjusted to a predetermined temperature by a temperature adjuster 11. This makes it possible to maintain the uniform heating of the heater base 2 and perform cooling control on the heater base 2. A heat exchanger 12 is connected to the fluid discharge pipes 8a so as be able to remove the extra heat of the fluid that has become hot by the high-temperature heater base 2.

It is preferable that the temperature of the fluid which is let flow in the fluid passage 4 be approximately in a range of −10 to 800° C. In the case where a low-temperature fluid flows in the fluid passage 4, the ceramic heater base 2 may be damaged by a heat shock. It is therefore preferable to reduce the temperature of the fluid step by step by the temperature adjuster 11 in accordance with the heating temperature of the heater base 2 so that the excellent cooling efficiency is acquired within the range where heat-shock originated damages can be avoided. The step-by-step temperature reduction is accomplished by, for example, always setting the temperature of the fluid to a temperature lower than the temperature of the heater base 2 at equi-intervals from 100° C. to 200° C. and adequately lowering the temperature of the fluid when the temperature of the heater base 2 drops.

While a gas or a liquid is available as the fluid, it is preferable to use an inactive gas in consideration of possible leakage of the fluid in the chamber against a possible damage in the heater base 2. Of course, the fluid is not limited to a gas. Preferable gases are inert gases available, such as Ar, He, Ne and $N_2$ gases, at least one of which is selectively used or a proper combination of which is used. One preferable combination is a mixed gas of Ar and He. This is because the combination of high-cost He, which has a high thermal conductivity and low-cost Ar, can ensure the adequate cooling cost performance while keeping a relatively high cooling efficiency. From this point of view, the ratio of Ar to He is preferably 3:1. Alternatively, the ratio of He to Ar is 20% or more.

To use the ceramic heater system 1 thus constituted, power is supplied to the heater 3 from the power supply 6 with a semiconductor wafer W placed on the mounting surface 2a or the top surface of the heater base 2. This raises the temperature of the heater base 2 to a predetermined temperature under the control of the controller 7, thus heating the semiconductor wafer W to the predetermined temperature. As a predetermined fluid, such as a gas selected from, for example, Ar, He, Ne and $N_2$, is let flow in the fluid passage 4 at a predetermined flow rate at this time, the temperature controllability becomes higher so that the heater base 2 can keep the desired uniform heating performance.

At the time of cooling the ceramic heater system 1 down from the heating temperature, the fluid is let flow in the fluid passage 4 after power supply to the heater 3 is cut off. According to this embodiment, the heating efficiency does not decrease even if the cross-sectional area of the fluid passage 4, which differs from the fluid passage in the prior art that is located above the heater, is increased. Accordingly, the cross-sectional area of the fluid passage 4 increases, permitting a relatively large amount of fluid to flow inside. The ceramic heater system 1 is therefore cooled to a predetermined temperature in a short period of time.

A ceramic heater system according to the second embodiment of the invention will now be discussed with reference to FIG. 3 which shows the cross section of the ceramic heater system. To avoid the detailed description, like or same reference numerals are given to those components of the second embodiment which are the same as the corresponding components shown in FIG. 1. Like the first embodiment shown in FIG. 1, the second embodiment has a fluid supply source 10, a temperature adjuster 11 and a heat exchanger 12, though these components are not shown in FIG. 3. Likewise, all other embodiments, but the fifth embodiment (FIGS. 4 to 7, FIGS. 10 to 12), have a fluid supply source 10, a temperature adjuster 11 and a heat exchanger 12, though these components are not shown for the simplicity of drawings.

In the ceramic heater system of the second embodiment, a heater 13 buried in the heater base 2 is formed of graphite or glassy carbon and is arranged in a predetermined pattern (e.g., a spiral form).

In the ceramic heater system, the coefficients of thermal expansion of graphite and glassy carbon, materials for the heater 13, are respectively 2 to $3 \times 10^{-6}$/K and $1.5 \times 10^{-6}$/K to $2.5 \times 10^{-6}$/K, which are relatively close to the coefficient of thermal expansion of AlN of $4.6 \times 10^{-6}$/K, so that the heater base 2 can be used without being damaged even if the temperature is raised fast or dropped fast.

Figure 4:
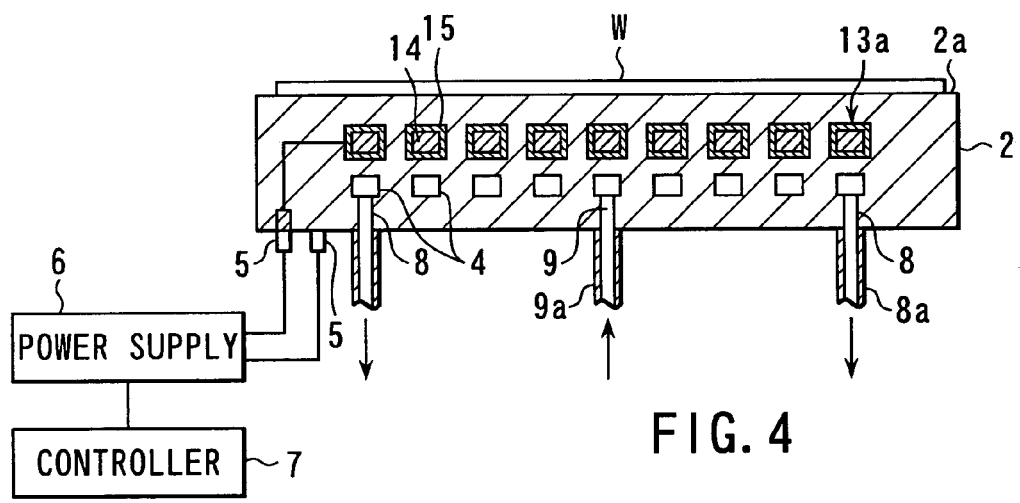
FIG. 4 is a cross-sectional view showing a ceramic heater system according to a modification of the second embodiment.

As a modification of the second embodiment shown in FIG. 4, a heater 13a having a core 14 of graphite or glassy carbon coated with a glassy BN layer 15 may be used. In this case, the glassy BN has a function of protecting the core 14 of graphite or glassy carbon and a buffer capability, thus ensuring faster temperature raising and faster temperature drop.

Figure 5:
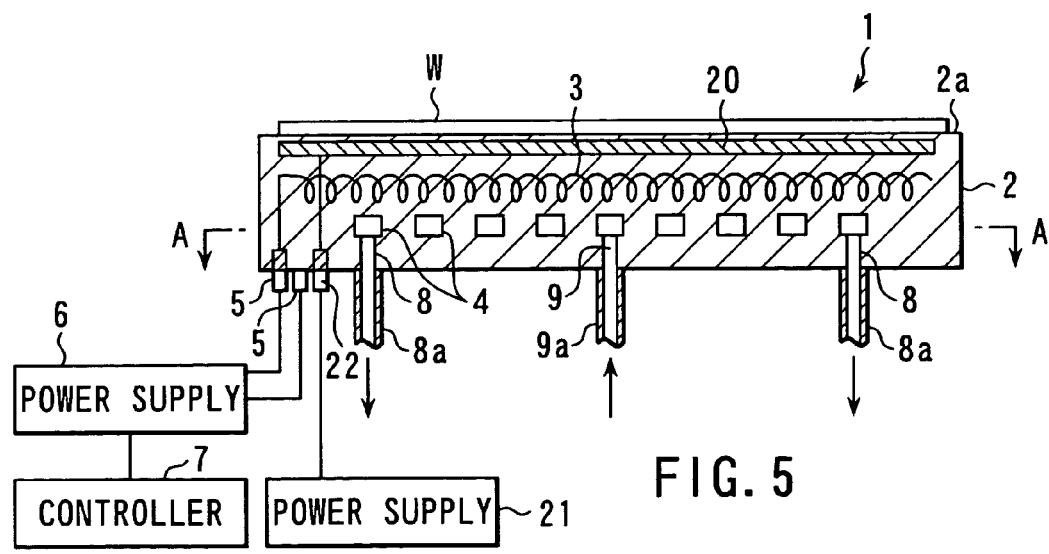
FIG. 5 is a cross-sectional view showing a ceramic heater system according to a third embodiment.

A ceramic heater system according to the third embodiment of the invention will now be discussed with reference to FIG. 5, which shows the cross section of the ceramic heater system. To avoid the detailed description, like or same reference numerals are given to those components of the third embodiment which are the same as the corresponding components shown in FIG. 1.

According to this embodiment, an electrode 20 is provided between the heater 3 of the heater base 2 and the mounting surface 2a and a DC power supply 21 for applying a voltage to the electrode 20 is connected to the heater 3 via a terminal 22. The DC power supply 21 may be replaced by a high-frequency power supply. This structure forms electrostatic chuck on the upper surface portion of the heater base 2.

As a DC voltage is applied to the electrode 20 in the ceramic heater system, a semiconductor wafer W to be mounted is electrostatically chucked to the mounting surface 2a of the heater base 2. This allows the semiconductor wafer W to be surely held even when the heater base 2 is used in the vacuum atmosphere. This embodiment can provide a compact structure which has the electrostatic chuck integrated with the ceramic heater.

Figure 3:
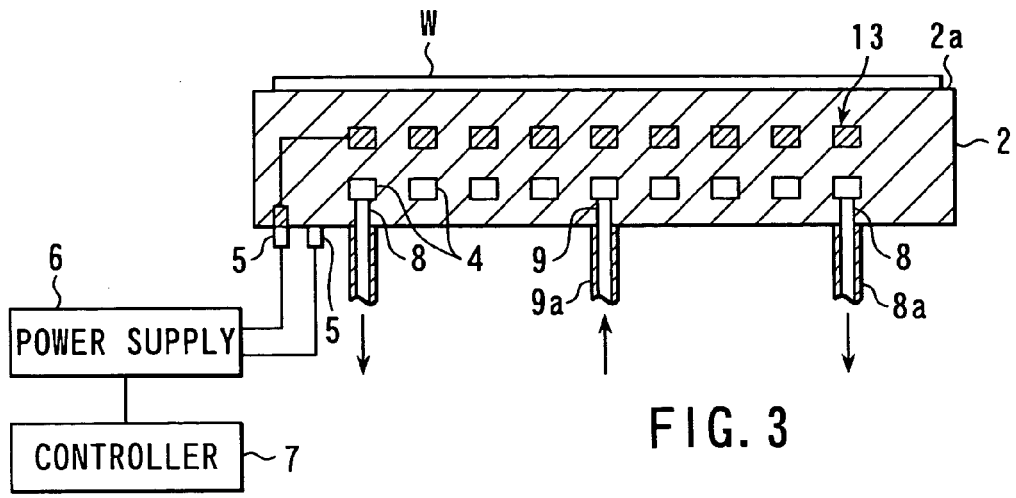
FIG. 3 is a cross-sectional view illustrating a ceramic heater system according to a second embodiment.

Needless to say, an electrode may be provided at a similar position in the heater bases whose structures are illustrated in FIGS. 3 and 4 to add an electrostatic chuck capability.

Figure 6:
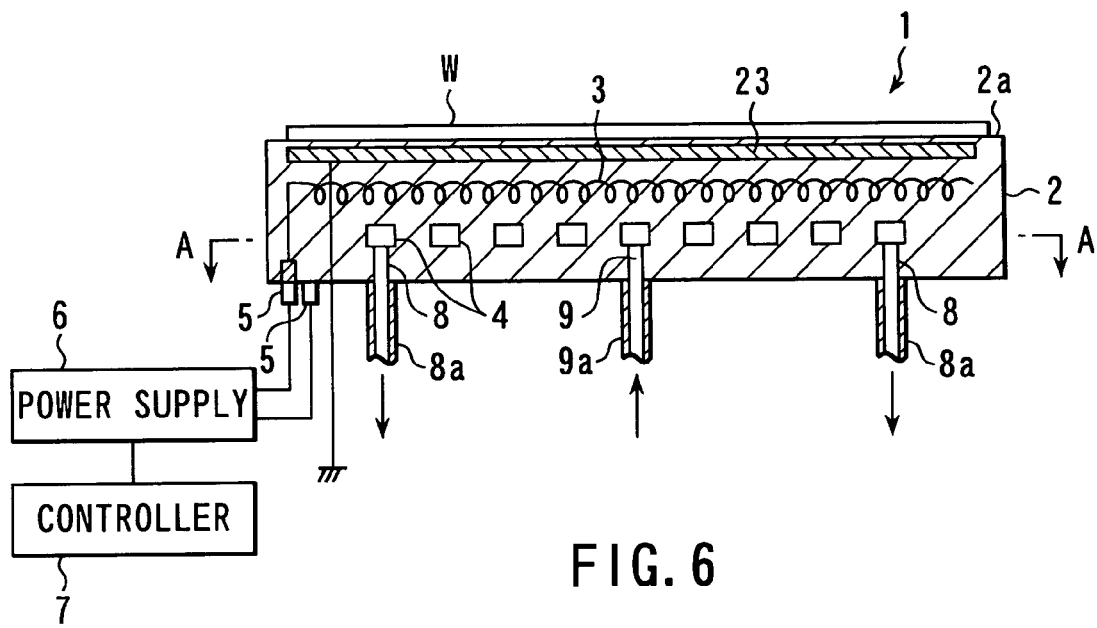
FIG. 6 is a cross-sectional view showing a ceramic heater system according to a modification of the third embodiment.

In the case where a plasma treatment is carried out by using the ceramic heater of each of the above-described embodiments, a plasma-producing electrode 23 is buried in the heater base 2 as in a modification of the third embodiment shown in FIG. 6. Plasma can be produced by grounding the electrode 23 and applying high-frequency power to the opposing electrode in the vacuum atmosphere. A DC voltage is applied to the electrode provided below the counter electrode. The DC voltage functions as a bias introducing ions and flaxes into the substrate. The etching rate and the deposition rate are thereby enhanced.

High-frequency power may be applied to the electrode 23. Instead of ground the electrode 23, a DC voltage may be applied to the electrode 23 so that the electrode 23 also serves as an electrode for the electrostatic chuck.

Figure 7:
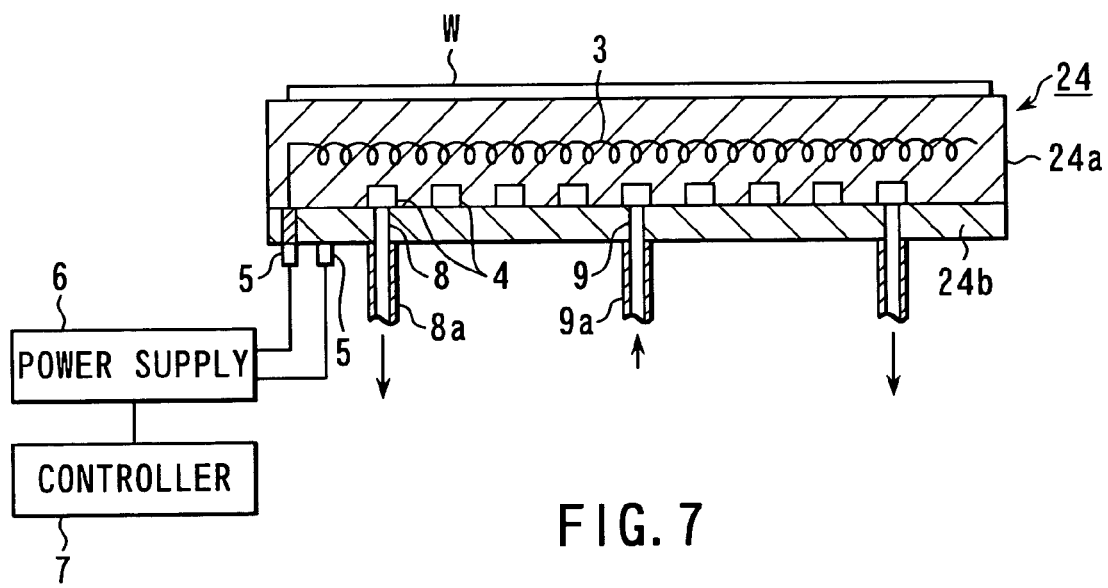
FIG. 7 is a cross-sectional view showing a ceramic heater system according to a fourth embodiment.

A ceramic heater system according to the fourth embodiment of the invention will now be described with reference to FIG. 7 which shows the cross section of the ceramic heater system. To avoid the detailed description, like or same reference numerals are given to those components of the fourth embodiment which are the same as the corresponding components shown in FIG. 1.

In this embodiment, a heater base 24 is separated into two portions at the bottom surface of the fluid supply passage 4: an upper heater base 24a in which the heater 3 is buried and a lower heater base 24b in which the fluid supply hole 9 and the fluid discharge holes 8 are formed. The upper heater base 24a and the lower heater base 24b are securely adhered together by an adhesive to be discussed later direct bond, ceramic, screws or the like. Alternatively, the upper and lower heater bases 24a and 24b may be made integral by a holder or the like which supports those heater bases 24a and 24b from the side while tightly connecting them. Such an integral structure makes the fluid passage 4 airtight.

An electrode may be provided in such a way as to add an electrostatic chuck capability in the fourth embodiment too.

According to this embodiment, the separation of the heater base 24 into two parts can facilitate the formation of the fluid passage 4.

According to the ceramic heater systems of the above-described embodiments, the fluid passage is provided below the heater. Thus, the heating efficiency of the heater to heat a semiconductor wafer does not fall even if the cross-sectional area of the fluid passage is increased. Therefore, the cross-sectional area of the fluid passage can be increased to supply a relatively large amount of fluid, thereby to cool the heater base in a short period of time. Even the provision of the fluid passage below the heater can ensure the desired uniform heating performance.

It is preferable that the fluid passage should be designed to have a plurality of concentric circular portions and a plurality of portions which link those concentric circular portions. Further, it is preferable that the fluid passage should have a fluid inlet formed in the center portion of the heater base and fluid outlets formed at end portions of the heater base. The fluid inlet can be provided at a position that is optimal in view of the positions of the heater power supply and the terminals of the temperature sensor. This structure can improve the uniform heating performance and the cooling efficiency.

The temperature of the fluid which flows in the fluid passage is variable within a range of −10 to 800° C. and preferably within a range of about 150 to 500° C. Of course, the temperature of the fluid can be changed in accordance with the conditions of the process. A fluid whose temperature is equal to or lower than 150° C. may be used in the case of exposing the interior of the chamber to the air for the purpose of maintenance.

In the case of causing a low-temperature fluid to flow in the fluid passage to cool the ceramic heater base, the temperature of the fluid should be set properly in accordance with the temperature of the heater base to prevent the heater base from being damaged by a heat shock. Specifically, the temperature of the fluid is equal to or lower than about 75% of the temperature of the heater base to be cooled. It is preferable that the temperature of the fluid should be reduced step by step in accordance with the cooling stage of the heater base. When the heater base is very hot, for example, heat-shock originated damages can be prevented by always adjusting the temperature of the fluid lower than the temperature of the heater base by 100 to 200° C. In the case of exposing the interior of the chamber to the air, the heater base can be cooled down efficiently if the temperature of the fluid is set lower when the temperature of the heater base drops close to 150° C.

Figure 8:
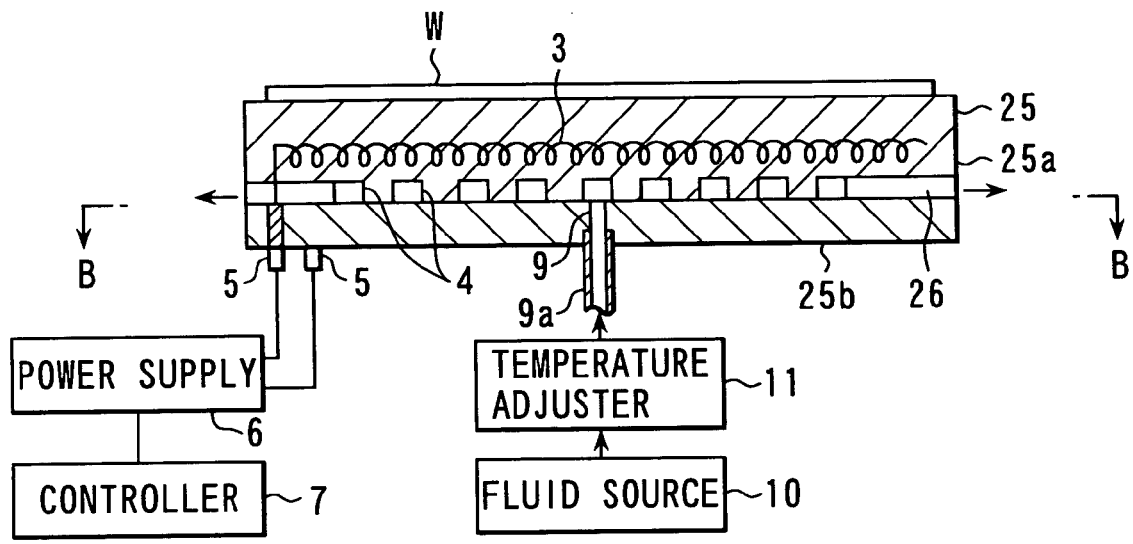
FIG. 8 is a cross-sectional view showing a ceramic heater system according to a fifth embodiment.
Figure 9:
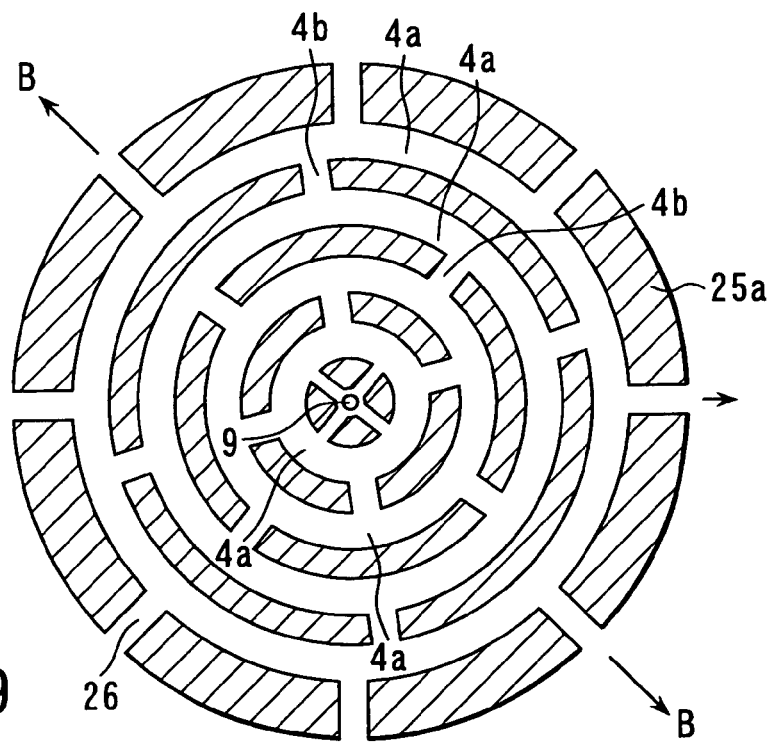
FIG. 9 is a horizontal cross-sectional view along the line B—B in FIG. 8.

FIG. 8 is a vertical cross-sectional view showing a ceramic heater system for processing a semiconductor wafer according to the fifth embodiment of the invention. FIG. 9 is a horizontal cross-sectional view taken along the line B—B in FIG. 8. To avoid the detailed description, like or same reference numerals are given to those components of the fifth embodiment which are the same as the corresponding components shown in FIG. 1.

In this embodiment, a heater base 25 is separated into two portions at the bottom surface of the fluid passage 4. That is, an upper heater base 25a in which the heater 3 is buried, and a lower heater base 25b in which the fluid supply hole 9 is formed. As shown in FIG. 9, fluid discharge holes 26 are formed sideways in the upper heater base 25a so that the fluid is discharged into the chamber. The lower heater base 25b is provided with the fluid source 10 which supplies the fluid and the temperature adjuster 11 which adjusts the temperature of the fluid. This structure of the embodiment causes the fluid to be discharged into the chamber, eliminating the need for the flow route from the fluid passage 4 to the heat exchanger 12 and thus the heat exchanger 12. The structure is simpler than the structure of the above-described embodiments in which the fluid is circulated in an airtight manner in the cycle of the fluid source 10 to the temperature adjuster 11 to the fluid passage 4 to the heat exchanger 12 while the temperature of the fluid is being adjusted. However, in the structure of the fifth embodiment, some kind of fluid should flow in the fluid passage 4 any time including during the processing of the semiconductor wafer in order to prevent the gas in the chamber from entering the fluid passage 4. The upper heater base 25a and the lower heater base 25b may be adhered integrally in the same way as mentioned in the foregoing description of the fourth embodiment. Further, an electrode may also be provided in the fifth embodiment to add an electrostatic chuck capability.

According to this embodiment, the separation of the heater base 25 into two parts can facilitate the formation of the fluid passage 4. As the fluid is discharged into the chamber, the structure becomes simpler.

FIG. 10A shows the horizontal cross section of a part of the heater base of a ceramic heater system for processing a semiconductor wafer according to the sixth embodiment. FIG. 10B shows the vertical cross section of a portion M shown in FIG. 10A. The illustrated example is adapted to the heater bases 24a and 25a of the fourth and fifth embodiments.

To improve the cooling efficiency, cooling fins 27 are provided on the heater-side surface of the fluid passage 4. The provision of the cooling fins 27 can increase the thermal conductivity to the fluid. Although two cooling fins 27 are shown, the number of the cooling fins is not limited to this quantity and a greater number of the cooling fins may be provided.

FIGS. 11A and 11B show a first modification of the sixth embodiment in which cooling fins 28 are provided on the surfaces of the fluid passage 4 perpendicular to the heater's side surfaces at positions relatively close to the heater. The cooling fins 28 demonstrate the same effect as the cooling fins 27 of the sixth embodiment. FIGS. 12A and 12B shows a second modification of the sixth embodiment in which the fluid passage has a irregularity surface with multiple crating and undulations. The irregularity surface increases the surface area to thereby increase the thermal conductivity to the fluid.

This embodiment is not limited to the provision of the aforementioned cooling fins or irregularity surface, but the heater-side surface of the fluid passage 4 may be designed in any shape as long as the surface area of the fluid passage 4 is increased. For example, the heater-side surface of the fluid passage 4 may have a irregularity surface of a sawtooth shape to improve the thermal conductivity to the fluid.

A description will now be given of a method of producing such a heater base.

First, a ceramic powder is put in a mold set in a press-molding machine and premolding is performed. Then, a continual recess is provided on the surface of the premolded article in accordance with the heater pattern. Next, the heater with terminals connected to both ends is retained in the recess, a ceramic powder is further put in the recess and is subjected to unconfined press molding, thus molding a disk-shaped article. The obtained article is sintered by hot pressing or the like, thus molding a first presintered body.

Subsequently, a ceramic powder is likewise subjected to unconfined press molding, thus molding a disk-shaped article, which is in turn sintered by hot pressing or the like, thus molding a second presintered body. Then, a groove corresponding to the fluid passage is made in the top surface of the second presintered body by an adequate method, such as sand blasting or etching. Further, a fluid supply hole and fluid discharge holes are formed. Finally, the first presintered body and the second presintered body are adhered hot direct bond by using an adhesive of glass, such as YSiAlON-based glass. While it is preferable to perform sintering by hot pressing, atmospheric pressure sintering may be used as well. Hot isostatic pressing (HIP) may be executed after atmospheric pressure sintering.

A description will now be given of a substrate processing apparatus in which a ceramic heater system having the above-described structure is installed.

Figure 13:
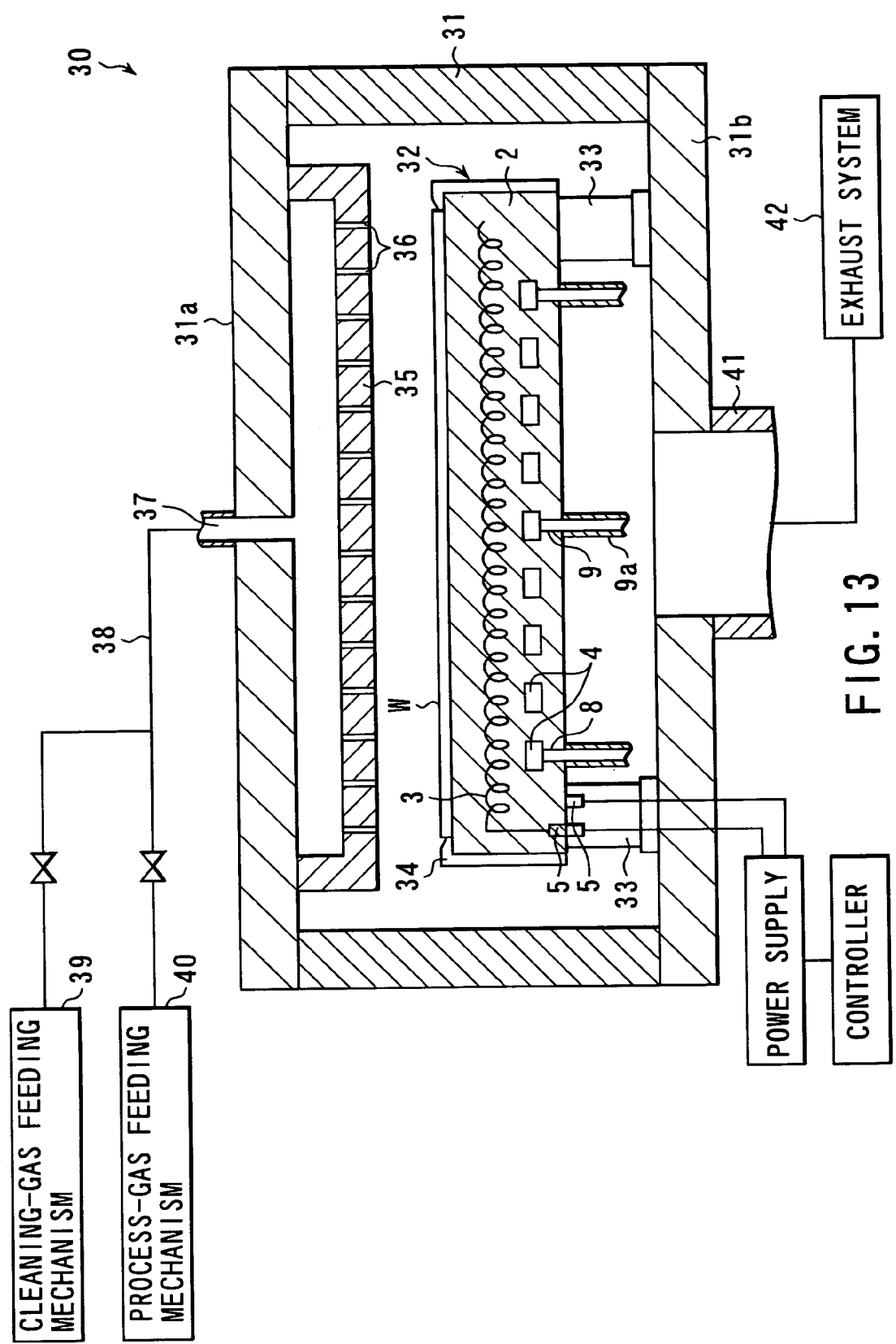
FIG. 13 is a cross-sectional view of a thermal CVD system which uses a ceramic heater system 32 embodying the invention.

FIG. 13 is a cross-sectional view of a thermal CVD system which uses a ceramic heater system 32 embodying the invention. This thermal CVD system 30 has a nearly cylindrical chamber 31 designed in an airtight manner. A semiconductor wafer W, a work to be processed, is supported horizontally in the chamber 31 and the ceramic heater system 32 which heats the semiconductor wafer W is supported on cylindrical support members 33. Provided on the peripheral edge of the heater base 2 is a guide ring 34 for guiding the semiconductor wafer W.

The ceramic heater system 32 is constructed in quite the same way as the ceramic heater system 1 shown in FIG. 1. That is, the heater 3 is buried in the ceramic heater base 2 and the fluid passage 4 is provided below the heater 3. Both end portions of the heater 3 are connected to the terminals 5 buried in the vicinity of the peripheral portion of the bottom of the heater base 2. The wires extending from the terminals 5 run inside the support members 33 to be connected to the power supply 6 whose output is controlled by the controller 7.

A shower head 35 is provided on a ceiling 31a of the chamber 31. Multiple gas discharge holes 36 for discharging a gas toward the semiconductor wafer W n the ceramic heater system 32 are formed in the shower head 35. A gas inlet 37 is formed in the upper portion of the shower head 35. The gas inlet 37 is connected to a cleaning-gas feeding mechanism 39 and a process-gas supply mechanism 40 via a gas feeding pipe 38.

The cleaning-gas supply mechanism 39 has a cleaning gas source for supplying a $ClF_3$ gas, for example, as a cleaning gas, so as to ensure regular in-situ cleaning of the interior of the chamber 31. The process-gas supply mechanism 40 has, for example, a $TiCl_4$ gas source, $NH_3$ gas source, Ar gas (dilution gas) source and so forth in the case where a film to be deposited is a TiN film, or has a $WF_6$ gas source, $SiH_2Cl_2$ gas source, Ar gas source and so forth in the case where a film to be deposited is a WSi film.

Connected to a bottom wall 31b of the chamber 31 is an exhaust pipe 41 which is connected to an exhaust system 42 including a vacuum pump. As the exhaust system 42 is activated, the interior of the chamber 31 can be depressurized to a predetermined degree of vacuum.

To deposit a predetermined thin film on the semiconductor wafer W using this substrate processing apparatus, first, the semiconductor wafer W is loaded into the chamber 31 and is placed on the mounting surface 2a of the ceramic heater system 32. The chamber 31 is discharged to the vacuum state by the exhaust system 42. Then, the heater base 2 is heated by the heater 3 up to, for example, about 500 to 700° C., thereby heating the overlying semiconductor wafer W to a predetermined temperature. Then, the process gas is supplied into the chamber 31 from the process-gas supply mechanism 40 via the gas feeding pipe 38 and film deposition is performed while keeping the internal pressure of the chamber 31 to a predetermined pressure.

In this case, the temperature controllability is enhanced by feeding a gas selected from, for example, Ar, He, Ne and $N_2$, allowing the heater base 2 to keep the desired uniform heating performance.

After film deposition is carried out on a predetermined number of semiconductor wafers W in this manner, the semiconductor wafers are removed from the chamber 31 and the ceramic heater system 32 is cooled to about 150 to 500° C. Then, the cleaning gas, e.g., $ClF_3$ gas, is supplied into the chamber 31 to perform in-situ cleaning of the chamber 31. At this time, the fluid is let flow in the fluid passage 4 after power supply to the heater 3 is cut off. In this case, the cross-sectional area of the fluid passage 4 can be increased to permit the flow of a relatively large amount of fluid. The ceramic heater system 32 can therefore be cooled to 150 to 500° C. in a short period of time. In the case of exposing the interior of the chamber 31 to the air for the purpose of maintenance or the like, the internal temperature in the chamber 31 should be reduced to near the room temperature. The temperature can be lowered so in a short period of time.

Figure 14:
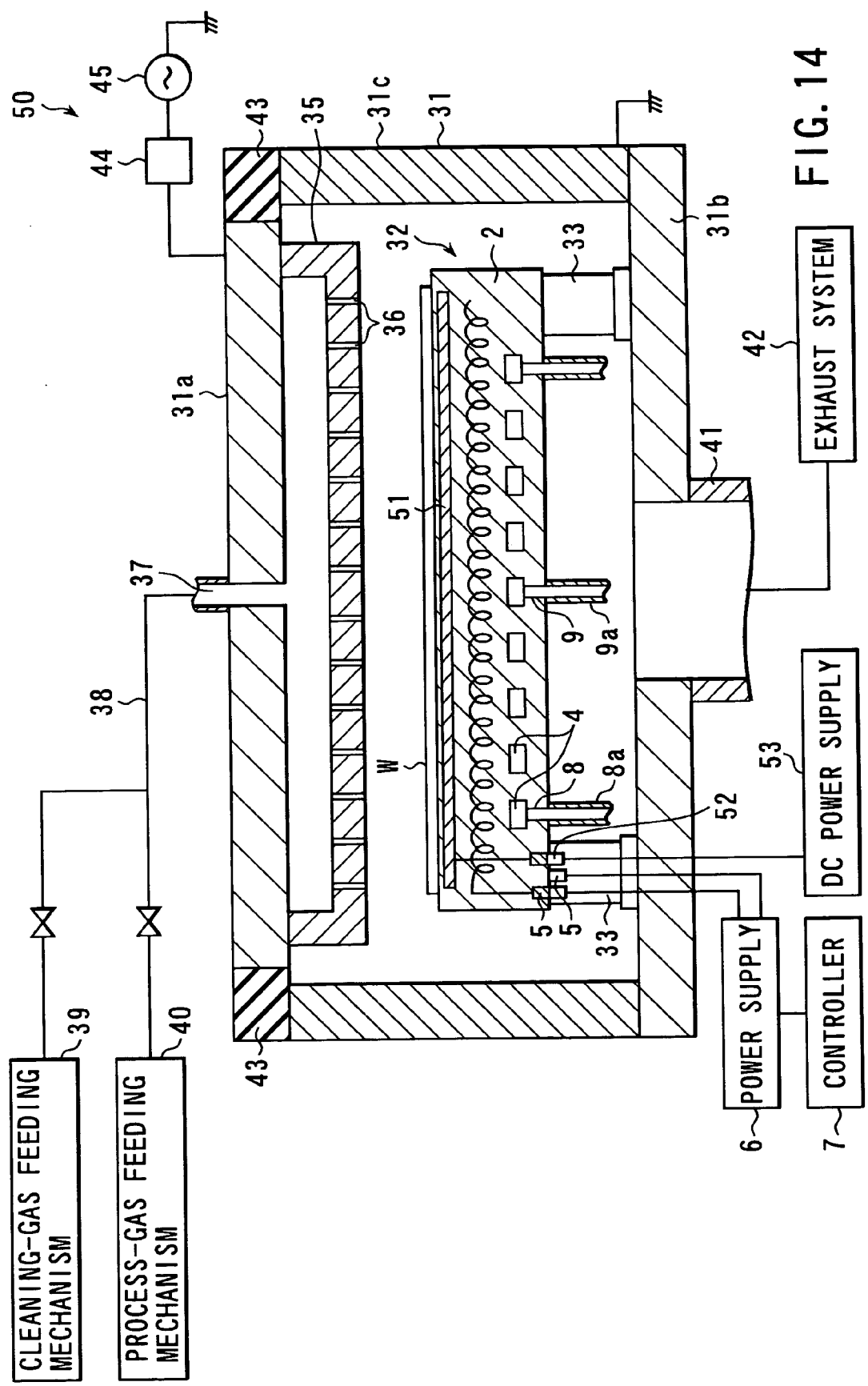
FIG. 14 is a cross-sectional view of a plasma CVD system which uses a ceramic heater system embodying the invention.

FIG. 14 is a cross-sectional view of a plasma CVD system which uses a ceramic heater system embodying the invention.

While the schematic structure of this plasma CVD system 50 is similar to the structure of the thermal CVD system shown in FIG. 13, the plasma CVD system 50 has an insulating member 43 provided between the ceiling 31a and a side wall 31c of the chamber 31 with the ceiling 31a connected via a matching circuit 44 to a high-frequency power supply 45. As high-frequency power of, for example, 13.56 MHz is supplied to the shower head 35 from the high-frequency power supply 45, the shower head 35 serves as an upper electrode.

A lower electrode 51 for producing plasma is buried in the heater base 2 of the ceramic heater system 32 above the heater 3. A DC power supply 53 is connected via a terminal 52 to the lower electrode 51 which also serves as an electrostatic chuck electrode. The plasma CVD system 50 deposits, for example, a Ti film.

In this case, the process-gas supply mechanism 40 has, for example, a $TiCl_4$ gas source, $H_2$ gas source, Ar gas (dilution gas) source and so forth. The other structure is the same as the thermal CVD system shown in FIG. 13, so that to avoid the redundant description, like or same reference numerals are given to the corresponding components.

To deposit a predetermined thin film on the semiconductor wafer W using this substrate processing apparatus, first, the semiconductor wafer W is loaded into the chamber 31 and is placed on the mounting surface of the ceramic heater system 32.

Then, the heater base 2 is heated by the heater 3 up to, for example, about 500 to 700° C. to heat the overlying semiconductor wafer W to a predetermined temperature. While the semiconductor wafer W is being heated up, the chamber 31 is discharged to the vacuum state by the exhaust system 42.

Then, the process gas is supplied into the chamber 31 from the process-gas supply mechanism 40 via the gas feeding pipe 38 and high-frequency power is supplied to the shower head 35 that serves as the upper electrode from the high-frequency power supply 45. As a result, a high-frequency electric field is produced between the shower head 35 and the electrode 23 and plasma is produced in the process-gas containing atmosphere.

At this time, a DC voltage is applied to the electrode 51 from the DC power supply 52 so that the semiconductor wafer W is electrostatically chucked on the surface of the heater base 2. Because the volume resistance of the heater base 2 varies in accordance with the temperature when such electrostatic capability is provided, the material whose resistance indicates an electrostatically chuckable property at the heating temperature is used for the heater base 2. In this case, the temperature controllability is enhanced by feeding a gas selected from, for example, Ar, He, Ne and $N_2$, allowing the heater base 2 to have the desired uniform heating performance.

After film deposition is carried out on a predetermined number of semiconductor wafers W, the semiconductor wafers are carry out from the chamber 31 and the ceramic heater system 32 is cooled to about 150 to 500° C., preferably to 200 to 300° C., to perform in-situ cleaning of the chamber 31, as done in the case of plasma CVD.

As described above, the cross-sectional area of the fluid passage 4 is increased, permitting the flow of a relatively large amount of fluid. The ceramic heater system 32 can therefore be cooled to 150 to 500° C. quickly. The internal temperature of the chamber 31 can be lowered to room temperature quickly by exposing the interior of the chamber 31 to the atmosphere for the purpose of maintenance or the like.

Figure 15:
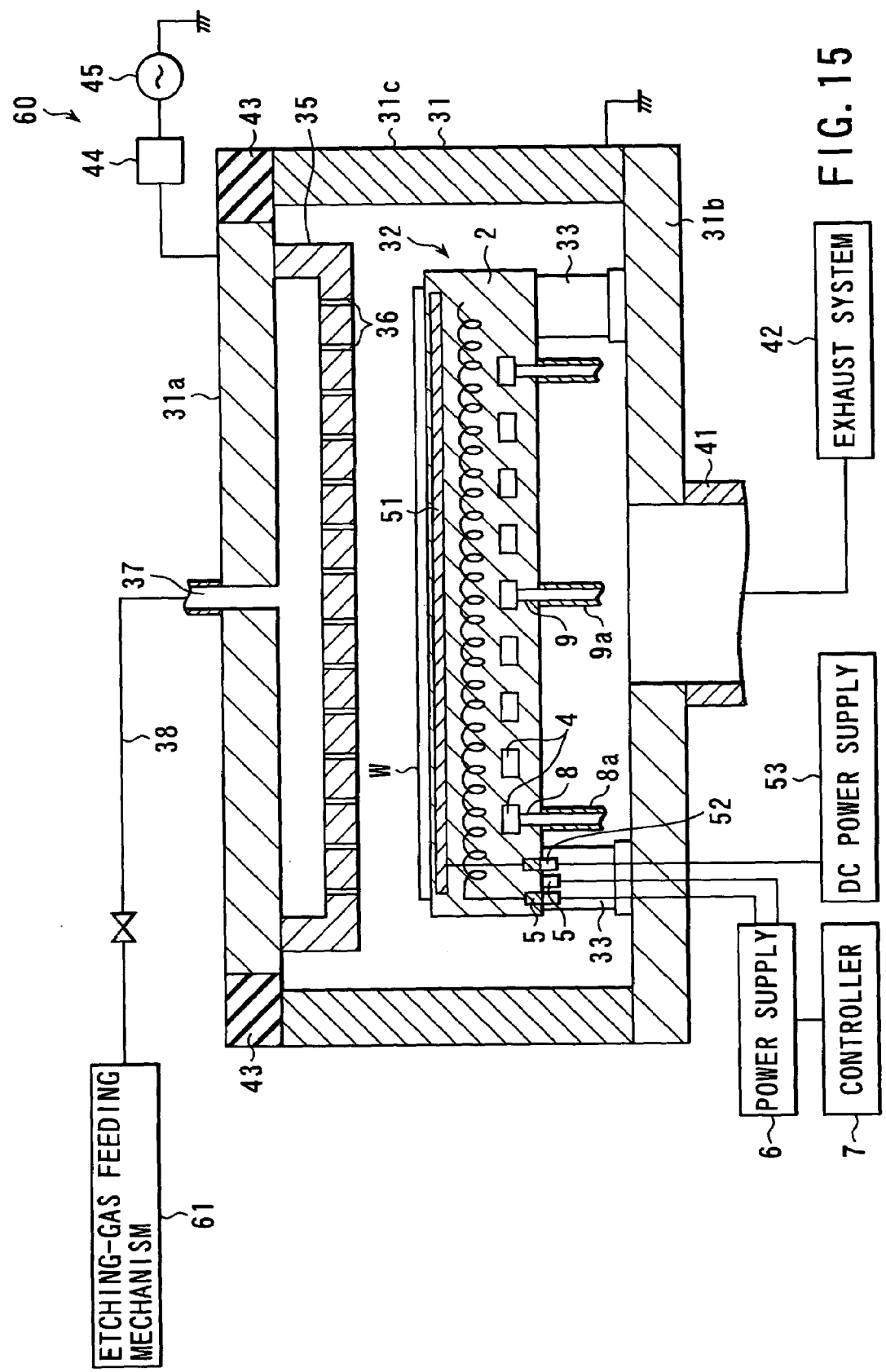
FIG. 15 is a cross-sectional view showing a plasma etching system which uses a ceramic heater system embodying the invention.

FIG. 15 is a cross-sectional view showing a plasma etching system which uses a ceramic heater system embodying the invention.

While the schematic structure of the plasma etching system 60 is similar to the structure of the plasma CVD system shown in FIG. 15, an etching-gas supply mechanism 61 is provided in place of the process-gas supply mechanism 40 because an etching gas is supplied. The etching gas, which varies depending on a film to be etched, may be a fluorine-contained gas, such as $CF_4$ gas, and the etching-gas feeding mechanism 61 is provided with a source for such an etching gas. The other structure is approximately the same as that of the plasma CVD system, so that to avoid the redundant description, like or same reference numerals are given to the corresponding components.

According to this etching system, the temperature of the heater base 2 can be controlled to a predetermined with a high precision by the heater 3 buried in the ceramic heater system 32 and the fluid that flows in the fluid passage 4, thus permitting the temperature of the semiconductor wafer W to be uniformly kept at a predetermined temperature. In the case of exposing the interior of the chamber 31 to the air, the heater base 2 can be cooled fast by causing the fluid to flow in the fluid passage 4 provided below the heater 3. In the plasma etching system 60, high-frequency power may be supplied to the lower electrode 51 as well as the shower head 35.

Needless to say, the systems illustrated in FIGS. 13 and 15 may use the ceramic heater system of each of the above-described embodiments.

It should be apparent to those skilled in the art that the present invention is not limited to the above-described embodiments but may be modified in various other forms without departing from the spirit or scope of the invention.

For example, the shapes of the fluid passages are to be considered as illustrative and not restrictive and may take other shapes. Further, the illustrated heaters of the individual embodiments are likewise to be considered as illustrative and not restrictive and other types may be used as well. While the typical pattern of the heater is a spiral form, it is in no way restrictive. Although the foregoing description of the individual embodiments has been given of the case where the ceramic heater system of the invention is adapted to thermal CVD, plasma CVD and plasma etching, the invention is not limited to those cases but may be adapted to other treatments, such as ashing. A work to be processed is not limited to a semiconductor wafer, but other substrates may be used as well.

As apparent from the foregoing description, when the ceramic heater system embodying the invention is installed in a CVD system, an etching system or the like, the down time thereof can be shortened. It is also possible to ensure the desired uniform heating performance even if the fluid passage is provided below the heater.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ceramic heater system comprising:
   a heater base integrally formed of a ceramic material, the heater base comprising:
   a mounting surface formed as an upper surface of the heater base and configured to receive an object thereon,
   a heater disposed in said heater base and configured to heat the object, and
   a gas passage provided in said heater base below said heater, said gas passage formed in a lower surface of the heater base and comprising a gas inlet and gas outlets configured to feed a gas into and out from the gas passage, the gas passage comprising a plurality of first passages disposed concentrically in the heater base and a plurality of second passages connecting the plurality of first passages without being aligned in a direction towards a center of concentricity of the plurality of first passages,
   wherein said heater base is configured to be cooled by feeding the gas having a temperature lower than a temperature of said heater base to the gas passage.

2. The ceramic heater system according to claim 1, wherein the gas inlet is formed in a central portion of a lower surface of said heater base, and the gas outlets are formed in outer circumference portions of the lower surface of said heater base.

3. The ceramic heater system according to claim 1, wherein the gas comprises at least one of Ar, He, Ne and $N_2$ gases.

4. The ceramic heater system according to claim 1, wherein said gas comprises Ar and He.

5. The ceramic heater system according to claim 1, wherein said heater has a high-melting-point metal patterned in a coil form to evenly generate heat in said heater base.

6. The ceramic heater system according to claim 1, wherein said heater comprises one of graphite and glassy carbon shaped in a pattern to evenly generate heat in said heater base.

7. The ceramic heater system according to claim 6, wherein said heater comprises one of glassy boron nitride coated on an outer surface of graphite and glassy carbon.

8. The ceramic heater system according to claim 1, further comprising:
   an electrode disposed in said heater base and located between the heater and the mounting surface; and
   power supply means for applying a direct current voltage to said electrode,
   wherein an electrostatic chuck is configured to be formed when the voltage is applied to the electrode, the electrostatic chuck configured to one of electrostatically attract and detach the object mounted on the heater base, and the electrostatic chuck and the heater form a one-body structure.

9. The ceramic heater system according to claim 1, wherein the gas inlet is formed in a central portion of a lower surface of said heater base, and the gas outlets are formed through circumferential side walls of said heater base.

10. A ceramic heater system comprising:
an upper heater base integrally formed of a ceramic material; and
a lower heater base formed of a ceramic material, the upper heater base and the lower heater base forming a one-body heater base, with a lower surface of the upper heater base contacting the lower heater base,
the one-body heater base comprising:
a mounting surface formed as an upper surface of the upper heater base and configured to receive an object thereon,
a heater disposed in said upper heater base and configured to heat the object, and
a gas passage provided below the heater and formed on the upper heater base and the lower heater base, the gas passage formed in a lower surface of the lower heater and comprising a gas inlet and gas outlets configured to feed a gas into and out from the gas passage, the gas passage comprising a plurality of first passages disposed concentrically in the lower heater base and a plurality of second passages connecting the plurality of first passages without being aligned in a direction toward a center of concentricity of the plurality of first passages,
wherein said upper and lower heater bases are configured to be cooled by feeding the gas having a temperature lower than a temperature of the upper heater base to the gas passage.

11. A processing apparatus comprising:
a chamber defining an interior configured to achieve a vacuum state by an exhaust system;
a ceramic heater system disposed in the chamber and configured to heat an object; and
processing means for performing a predetermined treatment on a substrate in said chamber,
said ceramic heater system comprising,
a heater base integrally formed of a ceramic material,
a mounting surface formed as an upper surface of the heater base and configured to receive the object thereon,
a heater disposed in said heater base and configured to heat said object, and
a gas passage provided in said heater base below said heater, the gas passage formed in a lower surface of the heater base and comprising a gas inlet and gas outlets configured to feed a gas into and out from the gas passage, the gas passage comprising a plurality of first passages disposed concentrically in the heater base and a plurality of second passages connecting the plurality of first passages without being aligned in a direction towards a center of concentricity of the plurality of first passages,
wherein said heater base is configured to be cooled by feeding the gas having a temperature lower than a temperature of said heater base to the gas passage.

12. The processing apparatus according to claim 11, wherein said processing means comprises:
a process-gas supply mechanism configured to feed a process gas; and
a shower head disposed in said chamber at a ceiling thereof and configured to introduce said process gas from said process-gas supply mechanism to form a film on the substrate by a reaction of the process gas.

13. The processing apparatus according to claim 11, further comprising:
a high-frequency power supply connected to said shower head and configured to electrically isolate said shower head and apply high-frequency power to said shower head; and
a lower electrode embedded in the heater base and located between an upper surface of the heater base and the heater,
wherein the shower head is configured such that plasma is generated by applying the high-frequency power to the shower head in the chamber which is in a gaseous atmosphere supplied with the process gas from the shower head, and a film is formed on the object by a reaction of the process gas with the plasma.

14. The processing apparatus according to claim 11, wherein said processing means comprises:
a gas feeding mechanism configured to feed an etching gas,
an electrically isolated shower head disposed in said chamber at a ceiling thereof and configured to introduce a process gas from said gas feeding mechanism,
a high-frequency power supply connected to said shower head and configured to apply high-frequency power to said shower head, and
a lower electrode embedded in the heater base and located between the heater base and the heater,
wherein the shower head and the lower electrode are configured such that, when the high-frequency power is applied to the shower head and/or the lower electrode in a chamber atmosphere into which the etching gas is supplied from the shower head, plasma is generated and a surface of the object is etched by a reaction of the etching gas.

15. The ceramic heater system according to claim 1, wherein the ceramic material comprises at least one of a nitride-based metallic material having a high melting point and an oxide-based metallic material having a high melting point.

16. The ceramic heater system according to claim 15, wherein the nitride-based metallic material comprises AlN.

17. The ceramic heater system according to claim 10, wherein the gas inlet is formed in a central portion of a lower surface of the heater base, and the gas outlets are formed in outer circumference portions of the lower surface of the heater base.

18. The ceramic heater system according to claim 10, wherein the gas comprises at least one of Ar, He, Ne and $N_2$.

19. The ceramic heater system according to claim 18, wherein the gas comprises Ar and He.

20. The ceramic heater system according to claim 10, wherein the heater comprises a winding including of a high-melting point metallic material and having a pattern to uniformly heat an internal region of the heater base.

21. The ceramic heater system according to claim 10, wherein the heater comprises one of graphite and vitreous carbon and has a pattern to uniformly heat an internal region of the heater base.

22. The ceramic heater system according to claim 21, wherein the heater comprises vitreous boron nitride over outer surfaces of at least one of graphite and glass carbon.

23. The ceramic heater system according to claim 11, further comprising:
an electrode disposed in the heater base and located between the heater and the mounting surface, and
power supply means for applying a voltage to the electrode, wherein, an electrostatic chuck is configured to be formed when the voltage is applied to the electrode, the electrostatic chuck configured to one of electrostatically attract and detach the object mounted on the heater base, the electrostatic chuck and the heater forming a one-body structure.

24. The ceramic heater system according to claim 10, further comprising:
- a gas supply source configured to output the gas to be supplied through the gas passage;
- a temperature control unit configured to control the gas from the gas supply source such that the gas has a temperature within a predetermined range, and to supply the gas into the gas passage; and
- a heat exchanger configured to remove heat provided by the heater base from the gas,
- wherein the gas supply source, the temperature control unit, the fluid passage and the heat exchanger are configured to simultaneously circulate and control the temperature of the gas.

25. The ceramic heater system according to claim 10, wherein the gas passage has an internal surface area configured to provide a predetermined heating/cooling efficiency.

26. The ceramic heater system according to claim 25, wherein the gas passage comprises a heat-radiation fin disposed on a heater side and a roughened inner surface disposed on the heater side.

27. The ceramic heater system according to claim 10, wherein the upper heater base and the lower heater base are coupled together by use of at least one of a ceramic adhesive and a screw.

28. A ceramic heater system comprising:
- a heater base integrally formed of a ceramic material, the heater base comprising:
  - a mounting surface formed as an upper surface of the heater base and configured to receive an object thereon;
  - a heater configured to heat the object, the heater disposed in said heater base and having a high-melting-point metal patterned in a coil form to evenly generate heat in the heater base; and
  - a gas passage provided in said heater base below said heater, the gas passage formed in a lower surface of the heater base and comprising a gas inlet and gas outlets configured to feed a gas into and out from the gas passage, the gas passage comprising a plurality of first passages disposed concentrically in the heater base and a plurality of second passages connecting the plurality of first passages without being aligned in a direction towards a center of concentricity of the plurality of first passages,
- wherein said heater base is configured to be cooled by feeding the gas having a temperature lower than a temperature of said heater base to the gas passage.

29. The ceramic heater system according to claim 28, further comprising:
- an electrode disposed in the heater base and located between the heater and the mounting surface; and
- power supply means for applying a voltage by one of a direct current supply and high-frequency power supply to the electrode,
- wherein an electrostatic chuck is configured to be formed when the voltage is applied to the electrode, the electrostatic chuck configured to at least one of electrostatically attract and detach the object mounted on the heater base, and the electrostatic chuck and the heater form a one-body structure.

30. The ceramic heater system according to claim 28, wherein the gas passage has an internal surface area configured to provide a predetermined heating/cooling efficiency.

31. The ceramic heater system according to claim 28, wherein the gas passage comprises a heat-radiating fin disposed on a heater side and a roughened inner surface disposed on the heater side.

32. The ceramic heater system according to claim 10, wherein the ceramic material comprises at least one of a nitride-based metallic material having a high melting point and an oxide-based metallic material having a high melting point.

33. The ceramic heater system according to claim 1, wherein the gas passage has an internal surface area configured to provide a predetermined heating/cooling efficiency.

34. The ceramic heater system according to claim 11, further comprising:
- a gas supply source and a gas discharge line connected to the gas inlet and the gas outlets of the gas passage.

35. The ceramic heater system according to claim 5, wherein the high-melting-point metal comprises at least one of W, Mo and Pt.

36. The ceramic heater system according to claim 28, wherein the high-melting point metal comprises at least one of W, Mo, and Pt.

* * * * *